United States Patent
Yamamoto et al.

(10) Patent No.: US 7,443,035 B2
(45) Date of Patent: Oct. 28, 2008

(54) METHOD OF FORMING A PENETRATION ELECTRODE AND SUBSTRATE HAVING A PENETRATION ELECTRODE

(75) Inventors: Satoshi Yamamoto, Tokyo (JP); Takashi Takizawa, Tokyo (JP)

(73) Assignee: Fujikura Ltd., Tokyo (JP)

( * ) Notice: Subject to any disclaimer, the term of this patent is extended or adjusted under 35 U.S.C. 154(b) by 140 days.

(21) Appl. No.: 11/447,257

(22) Filed: Jun. 6, 2006

(65) Prior Publication Data

US 2006/0281294 A1    Dec. 14, 2006

Related U.S. Application Data

(62) Division of application No. 10/736,581, filed on Dec. 17, 2003, now Pat. No. 7,094,677.

(30) Foreign Application Priority Data

Dec. 20, 2002    (JP) .............................. 2002-370201

(51) Int. Cl.
*H01L 23/34* (2006.01)
(52) U.S. Cl. ...................................... 257/774; 257/700
(58) Field of Classification Search ................. 257/700, 257/774
See application file for complete search history.

(56) References Cited

U.S. PATENT DOCUMENTS 5,986,339 A * 11/1999 Pai et al. ..................... 257/700
6,452,117 B2 * 9/2002 Curcio et al. ............... 174/262
2002/0192939 A1   12/2002 Sugihara
2004/0072422 A1    4/2004 Sinha
2004/0137701 A1    7/2004 Takao
2005/0282383 A1   12/2005 Farnworth

FOREIGN PATENT DOCUMENTS

| JP | 63-263734 A | 10/1988 |
| JP | 06-204191 A | 7/1994 |
| JP | 9-17828 A | 1/1997 |
| JP | 2000-68409 A | 3/2000 |
| JP | 2001-111190 A | 4/2001 |
| JP | 2002-158191 A | 5/2002 |
| JP | 2002-368082 A | 12/2002 |

* cited by examiner

*Primary Examiner*—Roy K Potter
(74) *Attorney, Agent, or Firm*—Sughrue Mion, PLLC

(57) ABSTRACT

A method of forming a penetration electrode in which an electroconductive substance is inserted into a micropore that has one end blocked off only by wiring and a pad formed by an electroconductive substance without the wiring and pad being broken. In this method of forming a penetration electrode, an electroconductive substance is inserted into the micropore that penetrates a substrate and that has one aperture blocked off by an electroconductive thin film. After a protective member that holds the electroconductive thin film is provided on a surface on the electroconductive thin film side of the substrate, an electroconductive substance is inserted from the other aperture of the micropore.

4 Claims, 4 Drawing Sheets

US 7,443,035 B2

METHOD OF FORMING A PENETRATION ELECTRODE AND SUBSTRATE HAVING A PENETRATION ELECTRODE

This is a divisional of application Ser. No. 10/736,581 now U.S. Pat. No. 7,094,677 filed Dec. 17, 2003. The entire disclosure of the prior application, application Ser. No. 10/736,581 is hereby incorporated by reference. Priority is claimed on Japanese application No. 2002-370201, filed Dec. 20, 2002, the content of which is incorporated herein by reference.

BACKGROUND OF THE INVENTION

1. Field of the Invention

The present invention relates to a method of forming a penetration electrode and to a substrate with an attached penetration electrode. In particular, the present invention relates to a method of forming a penetration electrode that is suitable when manufacturing a penetration electrode used in wiring in electronic devices and optical devices and the like, or in a wiring layer when a device is connected in a stack. The invention also relates to a substrate with an attached penetration electrode.

2. Description of Related Art

In order to reduce the size and raise the functionality of electronic devices and optical devices, or in order to stack these devices, a penetration electrode is sometimes used to electrically connect the front and rear surface sides of a substrate. Conventionally, this penetration electrode is manufactured, for example, by a method such as that shown in FIGS. 1A to 1C.

As is shown in FIG. 1A, wiring and a pad formed by an electroconductive thin film 2 are provided on one main surface A of a substrate 1. This wiring and pad are used for making an electrical connection with other substrates or devices.

First, as is shown in FIG. 1B, a micropore 3 is formed directly beneath the electroconductive thin film 2 extending from another main surface B of the substrate 1. Examples of the method used to form the micropore 3 include deep-reactive ion etching (DRIE) typified by inductively coupled plasma-reactive ion etching (ICP-RIE), anisotropic etching using a KOH solution or the like, and laser processing. If necessary, an insulation layer can be formed on the surfaces of the main surface B and the hole wall of the micropore 3.

Next, as is shown in FIG. 1C, an electroconductive substance 4 is inserted into the micropore 3 from the main surface B side so as to completely fill the interior of the micropore 3. The method used to insert the electroconductive substance 4 may be a molten metal insertion method or a printing method. At this time, in order to electrically connect the wiring and pad formed by the electroconductive thin film 2 with the electroconductive substance 4, a penetration electrode that penetrates between the front and rear of the substrate 1 is formed at a distal end portion of the micropore 3 (see Japanese Patent Application Laid-Open (JP-A) No. 2002-158191).

As described above, in a conventional method of forming a penetration electrode, because one end of the micropore is blocked off only by the wiring and pad formed by the electroconductive thin film, and because the electroconductive thin film is often formed having a thickness of less than several μm or less, the mechanical strength of this portion is weak and, in some cases, breakages have occurred such as the thin film breaking while being transported during the manufacturing process.

Moreover, when inserting an electroconductive paste into the micropore using a printing method, it is desirable that the printing pressure be raised a certain amount in order to achieve a highly reliable electrical connection at the distal end portion of the micropore, however, there have been cases in which, when the printing pressure is high, the inserted electroconductive paste ends up breaking through the electroconductive thin film.

The present invention was conceived in view of the above circumstances and it is an object thereof to provide a method of forming a penetration electrode in which an electroconductive substance is inserted into a micropore, one end of which is covered only by wiring and a pad formed by an electroconductive substance, without the wiring or pad being broken, and to provide a substrate with an attached penetration electrode.

SUMMARY OF THE INVENTION

In order to achieve the above object, the present invention is a method of forming a penetration electrode in which an electroconductive substance is inserted into a micropore that penetrates a substrate and that has one aperture blocked off by an electroconductive thin film. A protective member is provided that holds the electroconductive thin film over the micropore. The protective member is provided in at least a portion of the electroconductive thin film over where the micropore is formed. An electroconductive substance is inserted from the aperture of the micropore opposite to the aperture blocked of by electroconductive thin film.

In the method of the present invention it is preferable that the electroconductive substance is formed by a metal and is inserted into the micropore using a molten metal insertion method.

Alternatively, it is also possible for the electroconductive substance to be formed by an electroconductive paste and to be inserted into the micropore using a printing method.

Furthermore, the present invention is a substrate with an attached penetration electrode having a penetration electrode formed by the method of forming a penetration 3 electrode of the present invention.

BRIEF DESCRIPTION THE DRAWINGS

FIGS. 1A, 1B, and 1C are cross-sectional views of the main portions showing a manufacturing procedure according to a conventional method of forming a penetration electrode.

FIGS. 2A, 2B, 2C, and 2D are cross-sectional views of the main portions showing a manufacturing procedure according to an embodiment of the method of the present invention.

DETAILED DESCRIPTION OF THE INVENTION

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

Embodiments of the present invention will now be described with reference made to the drawings.

FIGS. 2A to 2D show a manufacturing procedure according to an embodiment of the method of forming a penetration electrode of the present invention.

Figure 1A:
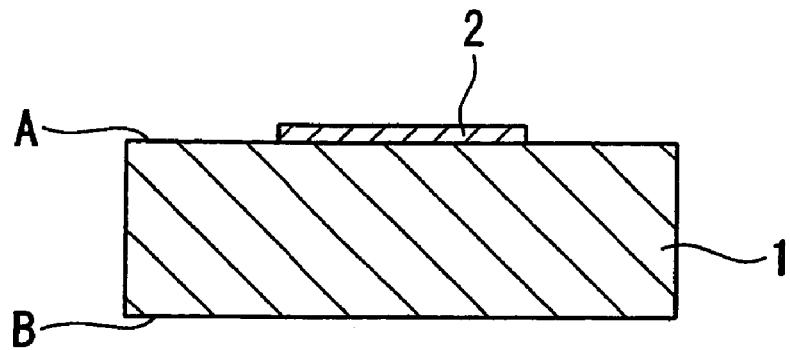
Figure 1B:
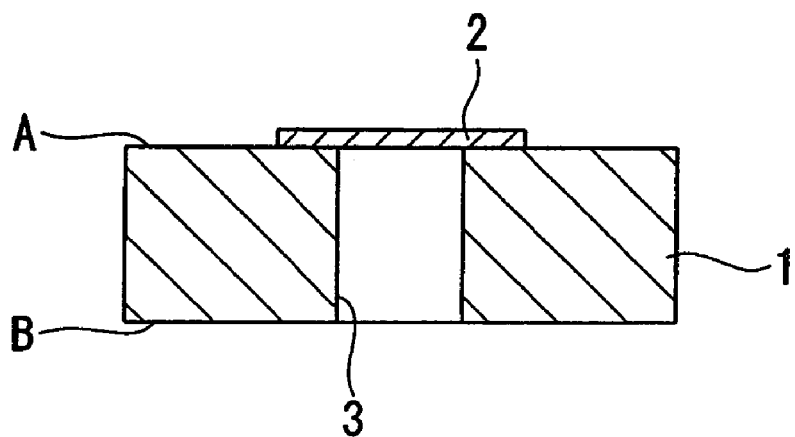
Figure 1C:
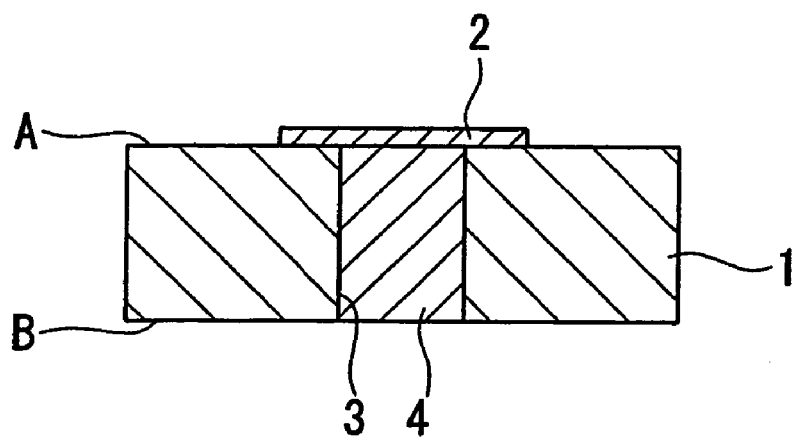
Figure 2A:
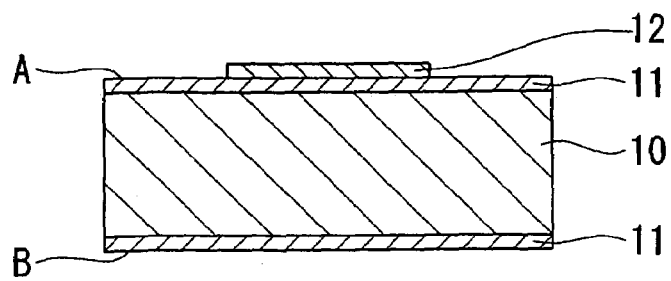

FIG. 2A shows a substrate 10 in which a penetration electrode is to be formed. In the present invention a variety of substrates can be used, such as a semiconductor substrate, a ceramic substrate, and a glass substrate. The thickness of the substrate can be selected in accordance with the intended use of the substrate and is between approximately 50 μm and 1 mm.

In the present embodiment a silicon substrate is used as the substrate 10. As is shown in FIG. 2A, insulating layers 11 formed by a silicon oxide film having a thickness of several μm or less, and preferably of approximately 1 μm, are formed on both main surfaces A and B of the substrate 10.

An electroconductive thin film 12 is formed on the one main surface A of the substrate 10. Where necessary, this electroconductive thin film 12 can be patterned and a pad and wiring formed for use when making an electrical connection with other substrates and devices.

A metal such as Al, Au, Pt, Ti, Ag, Cu, Bi, Sn, Ni, Cr, Zn and the like or alloys of these metals can be selected for use as the electroconductive thin film 12. The electroconductive thin film 12 can be formed by a variety of conventionally known methods such as a sputtering method, a vacuum deposition method, a plating method and the like. The thickness of the electroconductive thin film 12 is normally several μm or less.

Figure 2B:
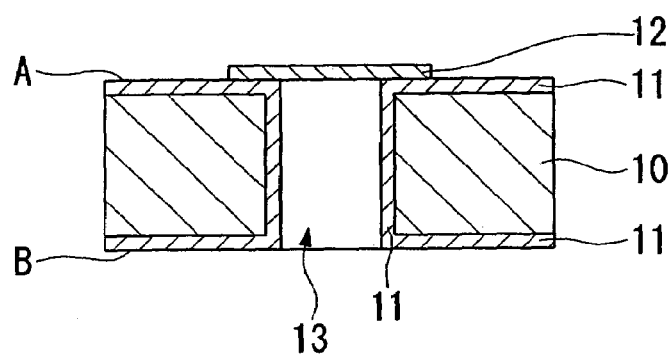

Next, as is shown in FIG. 2B, a micropore 13 is formed extending from the main surface B side of the substrate 10 to the electroconductive thin film 12. First, the insulating layer 11 of the main surface B at the position where the micropore 13 is formed is removed. Next, the substrate 10 and the insulating layer 11 on the main surface A side are etched by DRIE until the electroconductive thin film 12 is reached. The method used to form the micropore 13 may be anisotropic etching using a KOH solution or the like or laser processing and the like, in addition to deep-reactive ion etching (DRIE) typified by inductively coupled plasma-reactive ion etching (ICP-RIE). At the same time as the micropore is formed or else subsequent to the formation thereof, a new insulating layer 11 is formed on the hole wall of the micropore 13, resulting, as is shown in FIG. 2B, in the formation of a micropore 13 having one end thereof blocked off by the electroconductive thin film 12.

The diameter of the micropore 13 can be formed in a range of approximately 5 to 200 μm in accordance with the configuration of the penetration electrode 15 being manufactured.

Figure 2C:
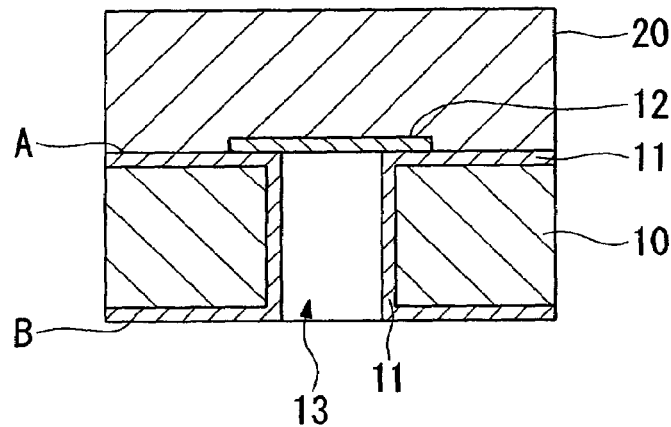
Figure 4:
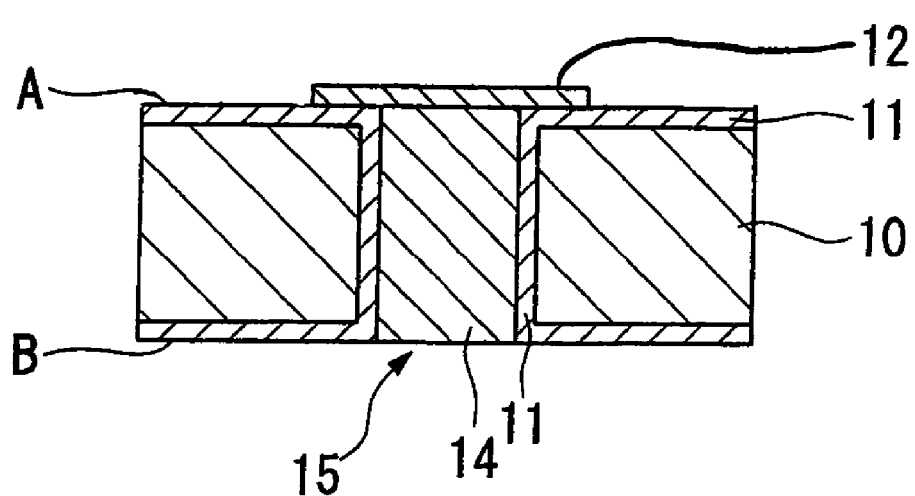
FIG. 4 is a cross-sectional view of the main portions showing another embodiment of the method of the present invention.

Next, as is shown in FIG. 2C, a protective member 20 is bonded to the main surface A of the substrate 10, so that the electroconductive thin film 12 is held by the protective member 20. Any member that has a flat surface portion and is able to hold the electroconductive thin film 12 by this flat surface portion may be used as the protective member 20 and examples thereof include a glass substrate, semiconductor substrates such as silicon, ceramic substrates, and plastic substrates. It is preferable that the protective member 20 is bonded to the main surface A of the substrate 10 using a hot melt adhesive, an ultraviolet hardening adhesive or the like. A hot melt adhesive is particularly preferable as it allows a protective member 20 that has been attached to the substrate 10 to be removed simply by heating the substrate 10. The protective member may be removed subsequent to the insertion of the electroconductive substance, as described below (see e.g. FIG. 4). Note that it is sufficient if the protective member 20 holds at least the micropore formation portion of the electroconductive thin film 12. However, as is shown in FIG. 2C, it is preferable that the protective member 20 holds the entire electroconductive thin film 12.

Figure 2D:
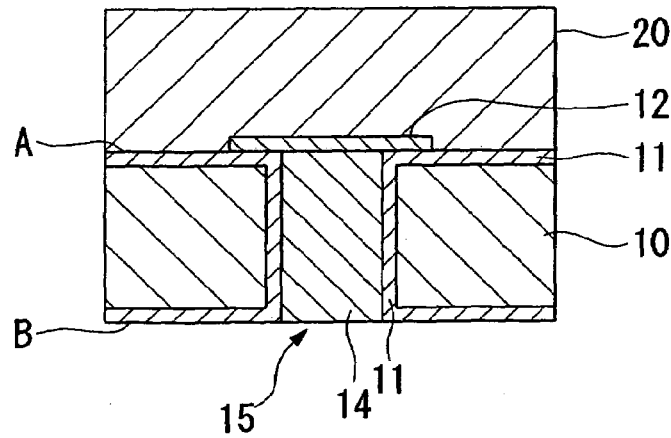

Next, as is shown in FIG. 2D, an electroconductive substance 14 is inserted into 6 the micropore 13 from the main surface B side using a printing method or molten metal insertion method.

If the printing method is used then an electroconductive paste such as Cu paste, Ag paste, carbon paste, Au—Sn paste, and the like can be used as the electroconductive substance to be inserted into the micropore 13.

If a molten metal insertion method is used then a low melting point metal such as Sn and In, or a solder such as Au—Sn based solder, Sn—Pb based solder, Sn based solder, Pb based solder, Au based solder, In based solder, Al based solder and the like can be used as the electroconductive substance to be inserted into the micropore 13.

If an electroconductive substance 14 such as Cu paste is inserted using a printing method then the printing pressure is set at a level sufficient to ensure an electrical connection between the electroconductive thin film 12 and the electroconductive substance 14. In the present embodiment, because one surface of the electroconductive thin film 12 is held by the protective member 20, even if the electroconductive substance 14 is inserted into the micropore 13 at high pressure, there is no breakage of the electroconductive thin film 12. The pressure at a side of the electroconductive film facing the protective member may be higher than the pressure on a side of the electroconductive film facing the first aperture.

In this way, by inserting the electroconductive substance 14 into the micropore 13, a penetration electrode 15 that electrically connects the front and rear of the substrate 10 is formed.

In the present embodiment, because the electroconductive substance 14 is inserted into the micropore 13, after the electroconductive thin film 12 is formed by wiring and a pad and the like that blocks off one end of the micropore 13, and since the electroconductive thin film 12 is held by the protective member 20, the wiring and pad that are formed by the slender electroconductive thin film 12 are protected by the protective member 20. Accordingly, it is possible to prevent breakages of the wiring and pad during transportation, which has been a problem conventionally.

Moreover, because it is possible to insert the electroconductive substance 14 into the micropore 13 at a higher pressure than is the case conventionally without breaking the wiring or pad or the like of the electroconductive thin film 12, a penetration electrode 15 having highly reliable electrical connections can be provided.

Furthermore, because a substrate with an attached penetration electrode manufactured using this method provides a reliable electrical connection between the electroconductive substance 14 and the electroconductive thin film 12 without any breakage of the electroconductive thin film 12 occurring, an improvement in reliability can be obtained.

Figure 3A:
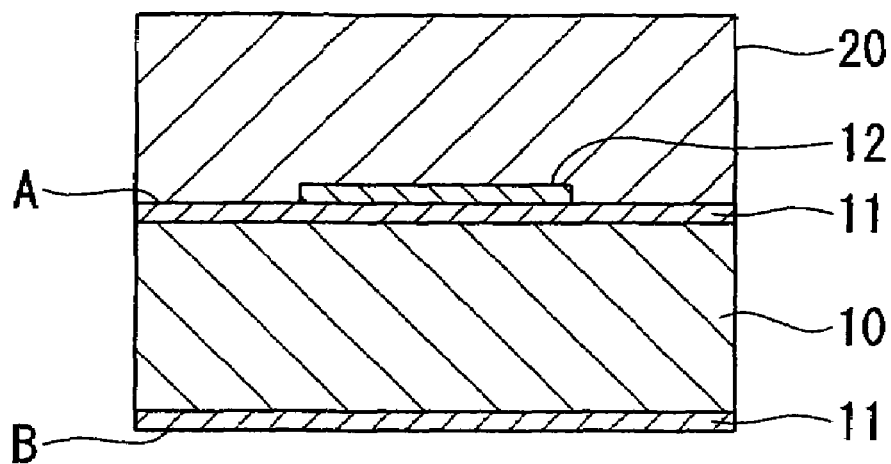
FIGS. 3A and 3B are cross-sectional view of the main portions showing another embodiment of the method of the present invention.
Figure 3B:
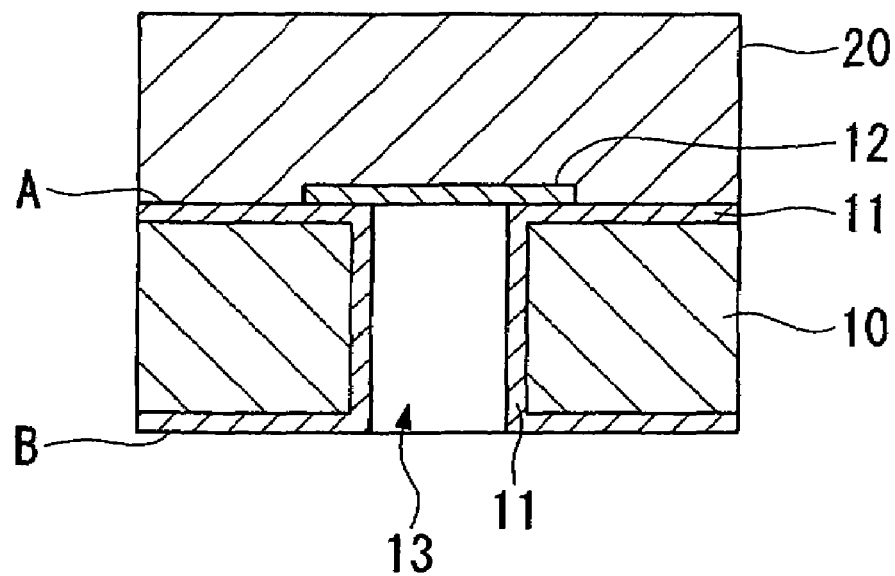

FIGS. 3A to 3B show another embodiment of the method of forming a penetration electrode of the present invention. In the previous embodiment the protective member 20 was bonded to the substrate 10 after the micropore 13 had been formed in the substrate 10, however, in the present embodiment, as is shown in FIG. 3A, after the electroconductive thin film 12 has been protected by bonding the protective member 20 onto the main surface A side of the substrate 10, the micropore 13 is then formed in the substrate 10, as is shown in FIG. 3B. Subsequently, the electroconductive substance 14 is inserted into the micropore 13 by a printing method or molten metal insertion method so as to form the penetration electrode 15.

In the present embodiment the same effects are achieved as in the previous embodiment, together with the extra effect that, by holding the electroconductive thin film 12 using the protective member 20 before the formation of the micropore 13, any breakage of the electroconductive thin film 12 in the formation process of the micropore 13 or during transportation to the subsequent process can be prevented.

EXAMPLES

A substrate with an attached penetration electrode was manufactured in accordance with the process is shown in FIGS. 2A to 2D.

A silicon substrate having a thickness of 100 µm was used as the substrate 10. As is shown in FIG. 2A, an insulating layer 11 formed by a silicon oxide film having a thickness of approximately 1 µm was formed on the two main surfaces A and B of the substrate 11, and an electroconductive thin film 12 formed from Al was further formed on the one main surface A.

Next, as is shown in FIG. 2B, a micropore 13 was formed extending from the main surface B side to the electroconductive thin film 12. First, the insulating layer 11 on the main surface B was removed at the position where the micropore 13 is formed. Next, the substrate 10 and the insulating layer 11 on the main surface A side were etched by DRIE until the electroconductive thin film 12 was reached. A new insulating layer 11 was formed on the hole wall of the micropore 13 so that a micropore 13 having one end thereof blocked off by the electroconductive thin film 12 was formed. The diameter of this micropore 13 was 100 µm.

Next, as is shown in FIG. 2C, a protective member 20 formed by a glass substrate having a thickness of 300 µm was bonded by an adhesive to the main surface A of the substrate 10, so that the electroconductive thin film 12 was held.

Next, as is shown in FIG. 2D, an electroconductive substance 14 formed by Cu paste was inserted into the micropore 13 from the main surface B side using a printing method. At this time, the printing pressure was set such that an electrical connection was achieved between the electroconductive thin film and the Cu paste. As a result, a penetration electrode 15 that electrically connected the front and rear of the substrate 10 was manufactured. The penetration electrode 15 that was obtained had no defects such as tears or breakages in the electroconductive thin film 12, and there was an excellent electrical connection between the electroconductive thin film 12 and the electroconductive substance 14 inserted into the micropore 13.

As has been described above, according to the method of the present invention, because an electroconductive substance is inserted into a micropore after an electroconductive thin film of wiring and a pad and the like that blocks off one end of the micropore has been protected by a protective member, the wiring and pad that are formed by a slender electroconductive thin film are protected by the protective member, and it is possible to prevent breakages of the wiring and pad during transportation, which has been a problem conventionally.

Moreover, because it is possible to insert the electroconductive substance into the micropore at a higher pressure than is the case conventionally without breaking the wiring or pad or the like of the electroconductive thin film, a penetration electrode having highly reliable electrical connections can be provided.

Furthermore, because the substrate with an attached penetration electrode of the present invention has a penetration electrode manufactured using the method of the present invention, it is possible to obtain a reliable electrical connection between the electroconductive substance and the electroconductive thin film without any breakage of the electroconductive thin film occurring, and to improve reliability.

What is claimed is:

1. A substrate with a penetration electrode comprising:
   a substrate having a first surface and a second surface;
   a first insulating layer covering said first surface of said substrate;
   an electroconductive film formed on at least a portion of said first insulating layer on said penetration electrode; and
   a protective member bonded on at least a portion of said electroconductive film formed on said first insulating layer;
   wherein said penetration electrode comprises:
   a micropore penetrating through said substrate and said first insulating layer;
      a second insulating layer covering an inside surface of said micropore; and
      an electroconductive substance filling an inside of said second insulating layer of said micropore;
   wherein said electroconductive substance is in contact with said electroconductive film, and
   wherein said first insulating layer is contiguous with said second insulating layer.

2. The substrate with the penetration electrode according to claim 1, further comprising:
   a third insulating layer on said second surface of said substrate, opposite to said first surface,
   wherein said micropore penetrates through said third insulating layer, and
   wherein said third insulating layer is contiguous with said second insulating layer.

3. The substrate with said penetration electrode according to claim 1, wherein the micropore is filled by the electroconductive substance using a molten metal insertion method, the electroconductive substance comprises low melting point metals such as Sn and In, or a solder such as Au—Sn based solder, Sn—Pb based solder, Sn based solder, Pb based solder, Au based solder, In based solder, and Al based solder.

4. The substrate with said penetration electrode according to claim 1, wherein the micropore is filled by the electroconductive substance using a printing method, the electroconductive substance comprises an electroconductive paste such as Cu paste, Ag paste, carbon paste, and Au—Sn paste.

* * * * *